US012680155B2

(12) United States Patent
Chang et al.

(10) Patent No.: US 12,680,155 B2
(45) Date of Patent: Jul. 14, 2026

(54) METHOD FOR FORMING FILM

(71) Applicant: Tripod Technology Corporation,
Taoyuan City (TW)

(72) Inventors: Yu-Ming Chang, Taoyuan City (TW);
Yun-Shan Wang, Taoyuan City (TW);
Hsien-Yeh Chen, Taoyuan City (TW);
Paichun Chang, Taoyuan City (TW)

(73) Assignee: Tripod Technology Corporation,
Taoyuan City (TW)

( * ) Notice: Subject to any disclaimer, the term of this
patent is extended or adjusted under 35
U.S.C. 154(b) by 0 days.

(21) Appl. No.: 19/027,124

(22) Filed: Jan. 17, 2025

(65) Prior Publication Data

US 2025/0340975 A1     Nov. 6, 2025

(30) Foreign Application Priority Data

May 1, 2024    (TW) .................................. 113116278

(51) Int. Cl.
*C23C 14/24*       (2006.01)
*C23C 14/12*       (2006.01)
(52) U.S. Cl.
CPC .............. *C23C 14/24* (2013.01); *C23C 14/12*
(2013.01)
(58) Field of Classification Search
CPC .................................. C23C 14/12; C23C 14/24
See application file for complete search history.

(56) References Cited

U.S. PATENT DOCUMENTS

| | | | |
|---|---|---|---|
| 8,790,863 B2 * | 7/2014 | Branton .............. | B81C 1/00531 |
| | | | 977/890 |
| 11,161,957 B2 * | 11/2021 | Chen .......................... | C08J 9/26 |
| 11,919,036 B1 * | 3/2024 | Sautter ................... | H05K 3/146 |
| 2013/0288182 A1 * | 10/2013 | Branton .............. | B81C 1/00531 |
| | | | 204/192.12 |
| 2017/0317277 A1 * | 11/2017 | Williams ............... | H10N 70/24 |
| 2018/0201749 A1 * | 7/2018 | Chen .......................... | C08J 9/26 |

OTHER PUBLICATIONS

Chang et al. Ice-templated synthesis of multicomponent porous
coatings via vapour sublimation and deposition polymerization.
Materials Today Bio. vol. 16. 2022 (Year: 2022).*

* cited by examiner

*Primary Examiner* — Cachet I Proctor
(74) *Attorney, Agent, or Firm* — MUNCY, GEISSLER,
OLDS & LOWE, P.C.

(57)                ABSTRACT
A method for forming film includes the following steps:
controlling a temperature of a workpiece in a chamber, so
that a gaseous state sacrificial material desublimates into
solid state on a surface of the workpiece to form a solid state
sacrificial material layer; controlling a pressure in the cham-
ber and the temperature of the workpiece, so that the solid
state sacrificial material layer starts gradually sublimating
into gaseous state; providing reactive polymer monomers
into the chamber, so that the reactive polymer monomers
start being deposited on the solid state sacrificial material
layer through an adsorption process, and a polymerization
reaction of the reactive polymer monomers is initiated, at the
same time, the solid state sacrificial material layer continues
gradually sublimating into gaseous state until completely
sublimating into gaseous state, and the reactive polymer
monomers form a polymer layer deposited on the surface of
the workpiece.

8 Claims, 8 Drawing Sheets

METHOD FOR FORMING FILM

FIELD OF THE INVENTION

The present invention is related to a method for forming film, especially a method for forming film that can increase surface roughness.

BACKGROUND OF THE INVENTION

Please refer to FIG. 8, which shows a cross-sectional schematic view of an embodiment of a film forming system of convention technology. The film forming system 9 of convention technology comprises: a deposition chamber 90, a reactive polymer monomers input terminal 91, a temperature control carrier 92, a vacuum pump 93, a pressure gauge 94, a precursor sublimation zone 95 and a pyrolysis zone 96. The vacuum pump 93 and the pressure gauge 94 are in communication with the deposition chamber 90. The pressure gauge 94 is used for monitoring a pressure in the deposition chamber 90. The vacuum pump 93 is used for controlling the pressure in the deposition chamber 90. One end of the temperature control carrier 92 disposed in the deposition chamber 90 is used for carrying a workpiece 97, and the temperature control carrier 92 can also control a temperature of the workpiece 97. The precursor sublimation zone 95 is in communication with the pyrolysis zone 96. The pyrolysis zone 96 is in communication with the deposition chamber 90 through the reactive polymer monomers input terminal 91. A method for forming film of conventional technology is a chemical vapor deposition (CVD) method. The method comprises following steps of: providing a workpiece 97 to a temperature control carrier 92 in a deposition chamber 90; controlling a pressure in the deposition chamber 90 within a deposition pressure range by a vacuum pump 93 (with a pressure gauge 94 monitoring the pressure), and controlling a temperature of the workpiece 97 within a deposition temperature range by the temperature control carrier 92; providing a plurality of reactive polymer monomers into the deposition chamber 90 through a reactive polymer monomers input terminal 91, such that the plurality of reactive polymer monomers is deposited on a surface 970 of the workpiece 97, and a polymerization reaction of the plurality of reactive polymer monomers is initiated, such that the plurality of reactive polymer monomers forms a polymer layer 98 deposited on the surface 970 of the workpiece 97 after the polymerization reaction; wherein a temperature in a precursor sublimation zone 95 is controlled to be greater than or equal to 0° C. and smaller than or equal to 270° C.; a pressure in the precursor sublimation zone 95 is controlled to be smaller than or equal to 0.5 Torr; a temperature in a pyrolysis zone 96 is controlled to be greater than or equal to 400° C.; a pressure in the pyrolysis zone 96 is controlled to be smaller than or equal to 0.5 Torr; wherein the deposition temperature range is smaller than or equal to 100° C.; the deposition pressure range is smaller than or equal to 0.5 Torr; wherein a powdered precursor 951 (para-cyclophane) is disposed in the precursor sublimation zone 95, and an argon (Ar) gas is input into the precursor sublimation zone 95 from an input terminal 950 of the precursor sublimation zone 95, such that the powdered precursor 951 (paracyclophane) is sublimated into a gaseous state paracyclophane in the precursor sublimation zone 95. The gaseous state paracyclophane flows into the pyrolysis zone 96 with the argon gas, such that the gaseous state paracyclophane is pyrolyzed into a plurality of reactive polymer monomers (para-xylylene). And then the plurality of reactive polymer monomers (para-xylylene) flows into the deposition chamber 90 through the reactive polymer monomers input terminal 91 with the argon gas. The plurality of reactive polymer monomers is deposited on the surface 970 of the workpiece 97 through an adsorption process, and the polymerization reaction of the plurality of reactive polymer monomers is initiated, such that the plurality of reactive polymer monomers forms a polymer layer 98 deposited on the surface 970 of the workpiece 97 after the polymerization reaction; wherein the polymer layer 98 is composed of poly(para-xylylene).

Please refer to FIG. 9, which shows an image of a film (the polymer layer 98 composed of poly(para-xylylene)) scanned by a scanning electron microscope (SEM), wherein the film is formed by using a method for forming film of conventional technology. Please refer also to FIG. 10, which shows a profile roughness distribution of a film (the polymer layer 98 composed of poly(para-xylylene)) scanned by a 3D surface profile laser microscope and an image of water droplets on the film (the polymer layer 98 composed of poly(para-xylylene)) formed by using a method for forming film of conventional technology. As shown in FIG. 10, the film (the polymer layer 98 composed of poly(para-xylylene)) formed by the method for forming film of conventional technology has a root mean square roughness (Rq) $=0.067$ μm; the roughness of the film is low. Furthermore, the image of water droplets on the film (the polymer layer 98 composed of poly(para-xylylene)) is shown in the upper right corner of FIG. 10; wherein a contact angle of water droplets on the film (the polymer layer 98 composed of poly(para-xylylene)) is approximately 90°.

The method for forming film of conventional technology (the chemical vapor deposition method) cannot form a film with higher roughness. Therefore, for the applications that require a film with higher roughness, it cannot be achieved simply by using the method for forming film of conventional technology. Moreover, if a film with low roughness is used as an exposed surface, a contact angle of water droplets (or liquid) on the film with low roughness cannot be too high. Hence, the method for forming film of conventional technology cannot form films for applications requiring higher contact angles. For example, medical equipment needs to prevent liquid from adhering to its exposed surfaces; hence, the surfaces of medical equipment require superhydrophobic surfaces (i.e., when liquid contacts with the superhydrophobic surface, its contact angle is higher) to significantly reduce liquid adhesion on the surfaces of medical equipment. Furthermore, superhydrophobic surfaces are often required for applications such as self-cleaning surfaces or anti-pollution surfaces.

SUMMARY OF THE INVENTION

The main technical problem that the present invention is seeking to solve is how to provide a method for forming film, such that the film formed has a higher roughness. Moreover, when the film with higher roughness is used as an exposed surface, a contact angle between liquid and the film can be greatly increased, and the film can even form a superhydrophobic surface.

In order to solve the above described problem and to achieve the expected effect, the present invention provides a method for forming film, wherein the method comprises following steps of: performing a desublimation process, the desublimation process includes following steps of: providing a workpiece into a chamber device; providing a gaseous state sacrificial material into the chamber device; and controlling a temperature of the workpiece within a desublimation temperature range, so that the gaseous state sacrificial material desublimates into solid state on a surface of the workpiece to form a solid state sacrificial material layer on the surface of the workpiece; and performing a sublimation and deposition process, the sublimation and deposition process includes following steps of: controlling a pressure in the chamber device within a sublimation deposition pressure range, and controlling the temperature of the workpiece in the chamber device within a sublimation deposition temperature range, so that the solid state sacrificial material layer on the surface of the workpiece starts gradually sublimating into gaseous state; and providing a plurality of reactive polymer monomers into the chamber device, so that the plurality of reactive polymer monomers starts being deposited on the solid state sacrificial material layer on the surface of the workpiece through an adsorption process, and a polymerization reaction of the plurality of reactive polymer monomers is initiated, at the same time, the solid state sacrificial material layer continues gradually sublimating into gaseous state; until the solid state sacrificial material layer completely sublimates into gaseous state, and the plurality of reactive polymer monomers forms a polymer layer deposited on the surface of the workpiece after the polymerization reaction.

In implementation, after performing the desublimation process and before performing the sublimation and deposition process, the method further comprises a following step of: removing the gaseous state sacrificial material from the chamber device.

In implementation, the chamber device includes a desublimation chamber and a sublimation and deposition chamber, wherein the desublimation process is performed in the desublimation chamber of the chamber device, wherein after performing the desublimation process and before performing the sublimation and deposition process, the method further comprises a following step of: moving the workpiece from the desublimation chamber of the chamber device to the sublimation and deposition chamber of the chamber device, such that the sublimation and deposition process is performed in the sublimation and deposition chamber of the chamber device.

In implementation, the sublimation deposition temperature range is greater than or equal to −20° C. and smaller than or equal to −4° C., and the sublimation deposition pressure range is smaller than or equal to 0.5 Torr.

In implementation, the material of the polymer layer is at least one selected from the group consisting of poly(p-xylylene), functionalized poly(p-xylylene), poly(tetrafluoroethylene), poly(alkyl acrylates), poly(3, 4-ethylenedioxythiophene), poly(4-vinylpyridine), poly(2-hydroxyethyl methacrylate), poly(1H, 1H, 2H, 2H-perfluorodecyl acrylate), poly(glycidyl methacrylate), poly(p-phenylenevinylene), poly(methyl methacrylate), poly(N-vinylcaprolactam), poly(N-isopropylacrylamide) and poly(dimethylsiloxane).

In implementation, the gaseous state sacrificial material is composed of water.

In implementation, during the desublimation process, the desublimation temperature range is smaller than or equal to 0° C., and the pressure in the chamber device is greater than or equal to 1 atm.

In implementation, the gaseous state sacrificial material is composed of carbon dioxide.

In implementation, during the desublimation process, the desublimation temperature range is smaller than or equal to −80° C., and the pressure in the chamber device is greater than or equal to 1 atm and smaller than or equal to 5 atm.

In implementation, the gaseous state sacrificial material is composed of iodine.

In implementation, during the desublimation process, the desublimation temperature range is smaller than or equal to 110° C., and the pressure in the chamber device is greater than or equal to 1 atm.

In implementation, during the desublimation process, a relative vapor concentration of the gaseous state sacrificial material in the chamber device is greater than or equal to 30%.

In implementation, the surface of the workpiece is an irregular surface, a flat surface, a curved surface, or any combination thereof.

In implementation, the surface of the workpiece is an outer surface, an inner surface having at least one opening, or any combination thereof.

In implementation, the material of the workpiece is at least one selected from the group consisting of metal, ceramic, polymer materials, semiconductor, oxide, nitride and sulfide.

For further understanding the characteristics and effects of the present invention, some preferred embodiments referred to drawings are in detail described as follows.

DETAILED DESCRIPTIONS OF PREFERRED EMBODIMENTS

Figure 1:
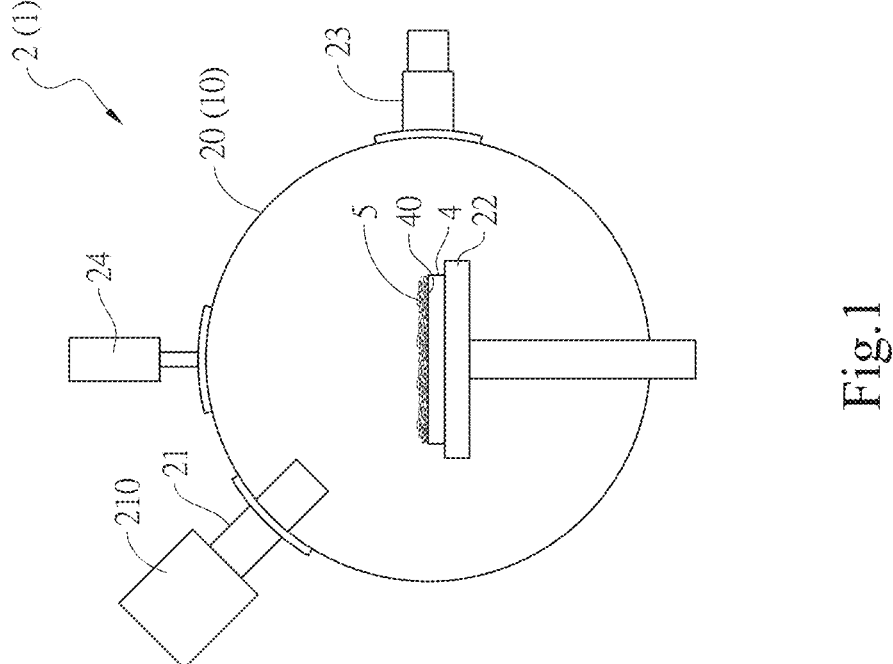
FIGS. 1 and 2 are respectively cross-sectional schematic views of an embodiment of a desublimation process equipment and a sublimation and deposition process equipment of a first film forming system of the present invention used for performing a desublimation process and a sublimation and deposition process of a method for forming film of the present invention respectively.
Figure 2:
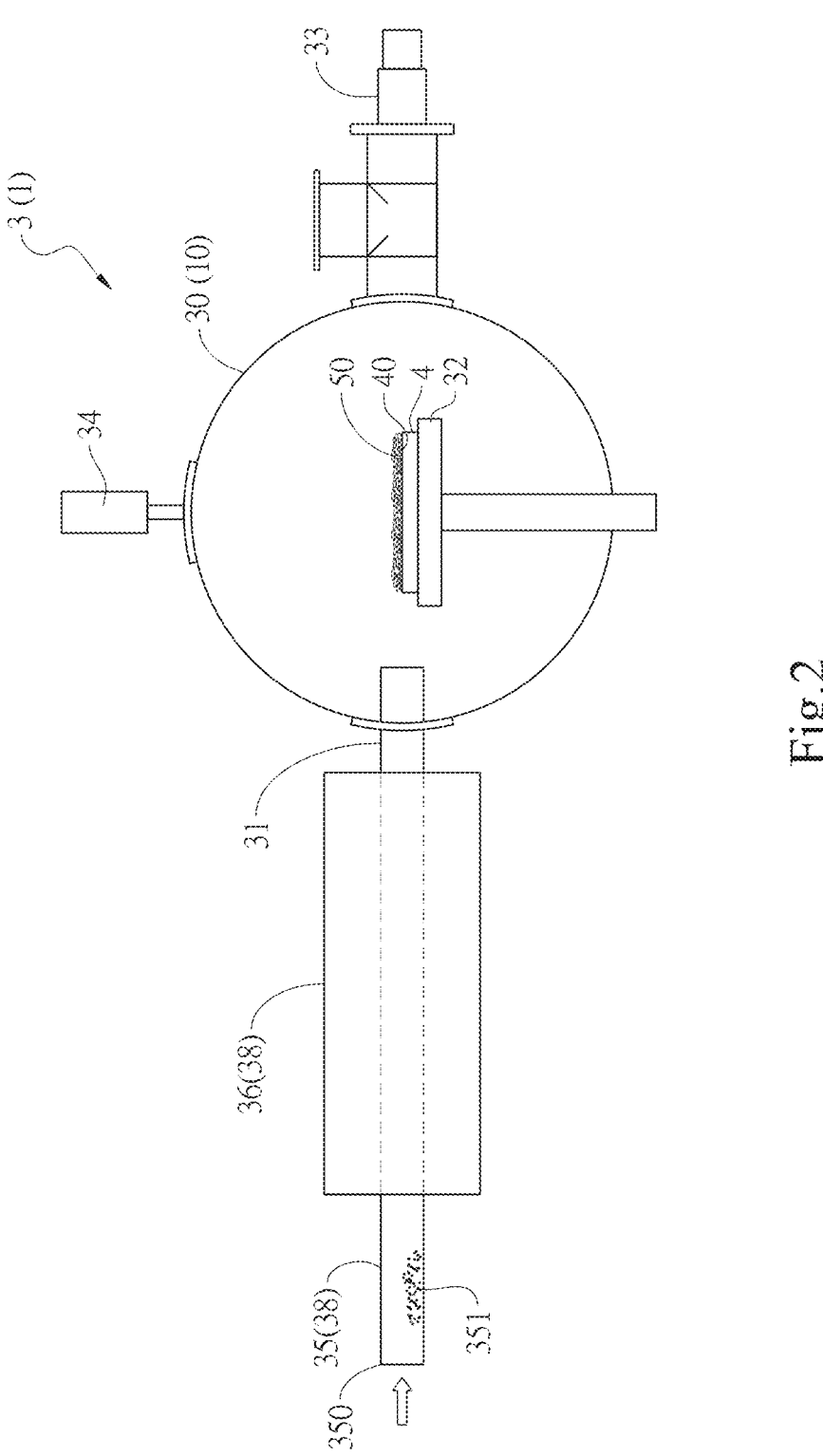

Please refer to FIGS. 1 and 2, which show respectively cross-sectional schematic views of an embodiment of a desublimation process equipment and a sublimation and deposition process equipment of a first film forming system of the present invention used for performing a desublimation process and a sublimation and deposition process of a method for forming film of the present invention respectively. Desublimation is the process of matter changing phase from gaseous state to solid state; while sublimation is the process of matter changing phase from solid state to gaseous state; that is, desublimation is the reverse process of sublimation. In the embodiment of FIGS. 1 and 2, a first film forming system 1 of the present invention comprises: a desublimation process equipment 2 (please referring to FIG. 1) and a sublimation and deposition process equipment 3 (please referring to FIG. 2), wherein the desublimation process equipment 2 of the first film forming system 1 of the present invention is used for performing a desublimation process of a method for forming film of the present invention; while the sublimation and deposition process equipment 3 of the first film forming system 1 of the present invention is used for performing a sublimation and deposition process of the method for forming film of the present invention. In FIG. 1, the desublimation process equipment 2 of the first film forming system 1 comprises: a desublimation chamber 20 of a chamber device 10, a sacrificial material input valve 21, a sacrificial material supply source 210, a first temperature control carrier 22, a pressure relief valve 23 and a first pressure gauge 24. The sacrificial material input valve 21 is in communication with the sacrificial material supply source 210 and the desublimation chamber 20 respectively. The sacrificial material supply source 210 inputs a gaseous state sacrificial material into the desublimation chamber 20 through the sacrificial material input valve 21. The sacrificial material input valve 21 can control an amount and a flow rate of the gaseous state sacrificial material input into the desublimation chamber 20. The pressure relief valve 23 and the first pressure gauge 24 are in communication with the desublimation chamber 20 respectively. The first pressure gauge 24 is used for monitoring a pressure in the desublimation chamber 20. When the sacrificial material supply source 210 inputs too much of the gaseous state sacrificial material into the desublimation chamber 20, the excess gaseous state sacrificial material can be discharged through the pressure relief valve 23. One end of the first temperature control carrier 22 disposed in the desublimation chamber 20 is used for carrying a workpiece 4, and the first temperature control carrier 22 can also control a temperature of the workpiece 4. In FIG. 2, the sublimation and deposition process equipment 3 of the first film forming system 1 comprises: a sublimation and deposition chamber 30 of the chamber device 10 (i.e., the chamber device 10 includes the desublimation chamber 20 and the sublimation and deposition chamber 30), a reactive polymer monomers input terminal 31, a second temperature control carrier 32, a second vacuum pump 33, a second pressure gauge 34, a precursor sublimation zone 35 and a pyrolysis zone 36. The second vacuum pump 33 and the second pressure gauge 34 are in communication with the sublimation and deposition chamber 30 respectively. The second pressure gauge 34 is used for monitoring a pressure in the sublimation and deposition chamber 30. The second vacuum pump 33 is used for controlling the pressure in the sublimation and deposition chamber 30. One end of the second temperature control carrier 32 disposed in the sublimation and deposition chamber 30 is used for carrying the workpiece 4, and the second temperature control carrier 32 can also control the temperature of the workpiece 4. The precursor sublimation zone 35 is in communication with the pyrolysis zone 36. The pyrolysis zone 36 is in communication with the sublimation and deposition chamber 30 through the reactive polymer monomers input terminal 31. The precursor sublimation zone 35 and the pyrolysis zone 36 can be considered as a reactive polymer monomers supply source 38.

A method for forming film of the present invention comprises following steps of: Step A: performing a desublimation process; Step B: moving a workpiece 4 from a desublimation chamber 20 of a chamber device 10 to a sublimation and deposition chamber 30 of the chamber device 10; and Step C: performing a sublimation and deposition process. The Step A (performing a desublimation process) comprises following steps of: providing the workpiece 4 to a first temperature control carrier 22 in the desublimation chamber 20 of the chamber device 10; providing a gaseous state sacrificial material into the desublimation chamber 20 of the chamber device 10 by a sacrificial material supply source 210 through a sacrificial material input valve 21; and controlling a temperature of the workpiece 4 within a desublimation temperature range by the first temperature control carrier 22, so that the gaseous state sacrificial material desublimates into solid state on a surface 40 of the workpiece 4 to form a solid state sacrificial material layer 5 on the surface 40 of the workpiece 4. The surface 40 of the workpiece 4 of the present invention is an exposed surface; therefore, the gaseous state sacrificial material can desublimate into solid state on the surface 40 of the workpiece 4 to form the solid state sacrificial material layer 5 on the surface 40 of the workpiece 4. In current embodiment, the gaseous state sacrificial material is gaseous water (i.e., water vapor); a pressure in the desublimation chamber 20 is greater than or equal to 1 atm (or standard pressure); the desublimation temperature range is smaller than or equal to $-100°$ C. When the gaseous water is provided into the desublimation chamber 20 by the sacrificial material supply source 210 through the sacrificial material input valve 21, such that a relative vapor concentration (i.e., a relative humidity) of the gaseous water in the desublimation chamber 20 is gradually increased, and then the gaseous water in the desublimation chamber 20 starts gradually desublimating into solid state (i.e., ice) on the surface 40 of the workpiece 4. A rate that the gaseous water desublimating into solid state ice in the desublimation chamber 20 is related to the relative vapor concentration (the relative humidity) of the gaseous water in the desublimation chamber 20. The rate that the gaseous water desublimating into solid state ice in the desublimation chamber 20 can be controlled by controlling the relative vapor concentration (the relative humidity) of the gaseous water in the desublimation chamber 20. In current embodiment, the relative vapor concentration (the relative humidity) of the gaseous water in the desublimation chamber 20 is controlled to be greater than or equal to 50%. As time goes by, the gaseous water in the desublimation chamber 20 gradually desublimates into solid state ice on the surface 40 of the workpiece 4 and gradually forms a solid state sacrificial material layer 5 (i.e., a solid ice layer) on the surface 40 of the workpiece 4. In the Step B, the workpiece 4 (the solid state sacrificial material layer 5 has been formed on the surface 40 of the workpiece 4) is moved from the desublimation chamber 20 of the chamber device 10 to the sublimation and deposition chamber 30 of the chamber device 10. The Step C (performing a sublimation and deposition process) comprises following steps of: controlling a pressure of the sublimation and deposition chamber 30 of the chamber device 10 within a sublimation deposition pressure range by a second vacuum pump 33 (with a second pressure gauge 34 monitoring the pressure), and controlling the temperature of the workpiece 4 on a second temperature control carrier 32 in the sublimation and deposition chamber 30 of the chamber device 10 within a sublimation deposition temperature range by the second temperature control carrier 32, such that the solid state sacrificial material layer 5 on the surface 40 of the workpiece 4 starts gradually sublimating into gaseous state; and providing a plurality of reactive polymer monomers into the sublimation and deposition chamber 30 of the chamber device 10 through a reactive polymer monomers input terminal 31, such that the plurality of reactive polymer monomers starts being deposited on the solid state sacrificial material layer 5 on the surface 40 of the workpiece 4 through an adsorption process, and a polymerization reaction of the plurality of reactive polymer monomers is initiated, at the same time, the solid state sacrificial material layer 5 continues gradually sublimating into gaseous state; until the solid state sacrificial material layer 5 completely sublimates into gaseous state, and the plurality of reactive polymer monomers forms a polymer layer 50 deposited on the surface 40 of the workpiece 4 after the polymerization reaction (the solid state sacrificial material layer 5 on the surface 40 of the workpiece 4 has completely sublimated into gaseous state). In current embodiment, a temperature in a precursor sublimation zone 35 is controlled to be greater than or equal to 0° C. and smaller than or equal to 270° C.; a pressure in the precursor sublimation zone 35 is controlled to be smaller than or equal to 0.5 Torr; a temperature in a pyrolysis zone 36 is controlled to be greater than or equal to 400° C.; a pressure in the pyrolysis zone 36 is controlled to be smaller than or equal to 0.5 Torr; wherein the sublimation deposition temperature range is greater than or equal to −20° C. and smaller than or equal to −4° C.; the sublimation deposition pressure range is smaller than or equal to 0.5 Torr; wherein a powdered precursor 351 (paracyclophane) is disposed in the precursor sublimation zone 35, and an argon (Ar) gas is input into the precursor sublimation zone 35 from an input terminal 350 of the precursor sublimation zone 35, such that the powdered precursor 351 (paracyclophane) is sublimated into a gaseous state paracyclophane in the precursor sublimation zone 35. The gaseous state paracyclophane flows into the pyrolysis zone 36 with the argon gas, such that the gaseous state paracyclophane is pyrolyzed into a plurality of reactive polymer monomers (para-xylylene). And then the plurality of reactive polymer monomers (para-xylylene) flows into the sublimation and deposition chamber 30 of the chamber device 10 through a reactive polymer monomers input terminal 31 with the argon gas. After the polymerization reaction, the plurality of reactive polymer monomers (para-xylylene) forms a polymer layer 50 deposited on the surface 40 of the workpiece 4, wherein the polymer layer 50 is composed of poly(para-xylylene).

In some embodiments, the first temperature control carrier 22 can be replaced by a carrier which does not have a temperature control function; while the desublimation chamber 20 of the chamber device 10 further has a temperature control function. Therefore, the temperature of the workpiece 4 can be controlled by controlling the temperature in the desublimation chamber 20 of the chamber device 10, such that the temperature of the workpiece 4 is within the desublimation temperature range.

Figure 3:
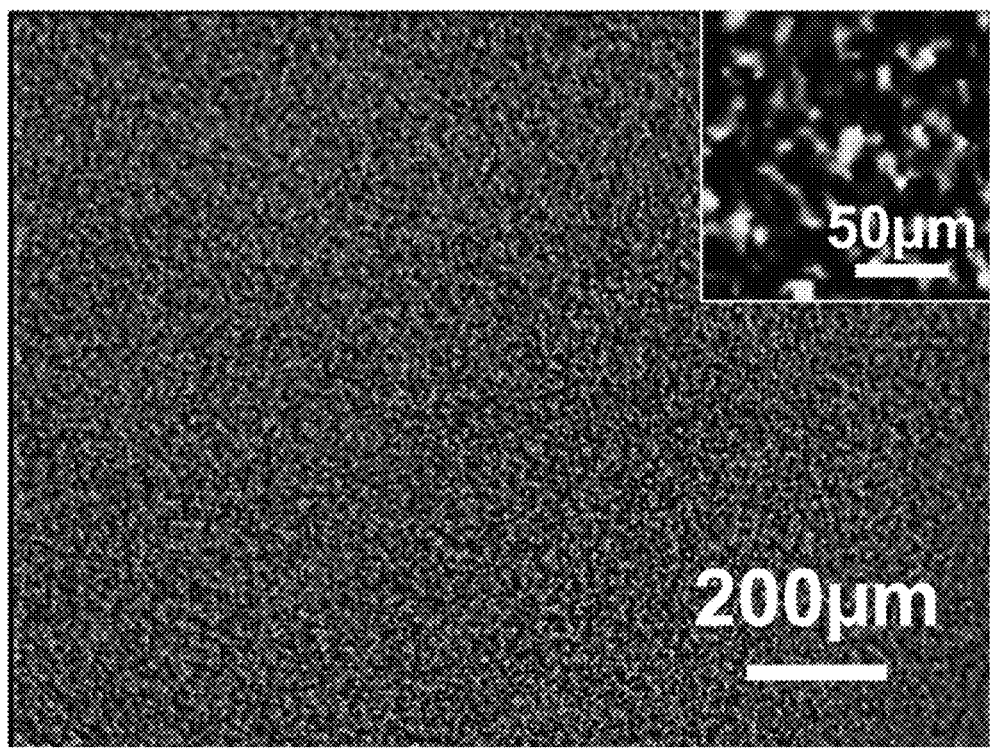
FIG. 3 is a microscopic image of a solid state sacrificial material layer (ice) formed by a gaseous state sacrificial material (water vapor) desublimating into solid state on a surface of a workpiece using a desublimation process of a method for forming film of the present invention.
Figure 4:
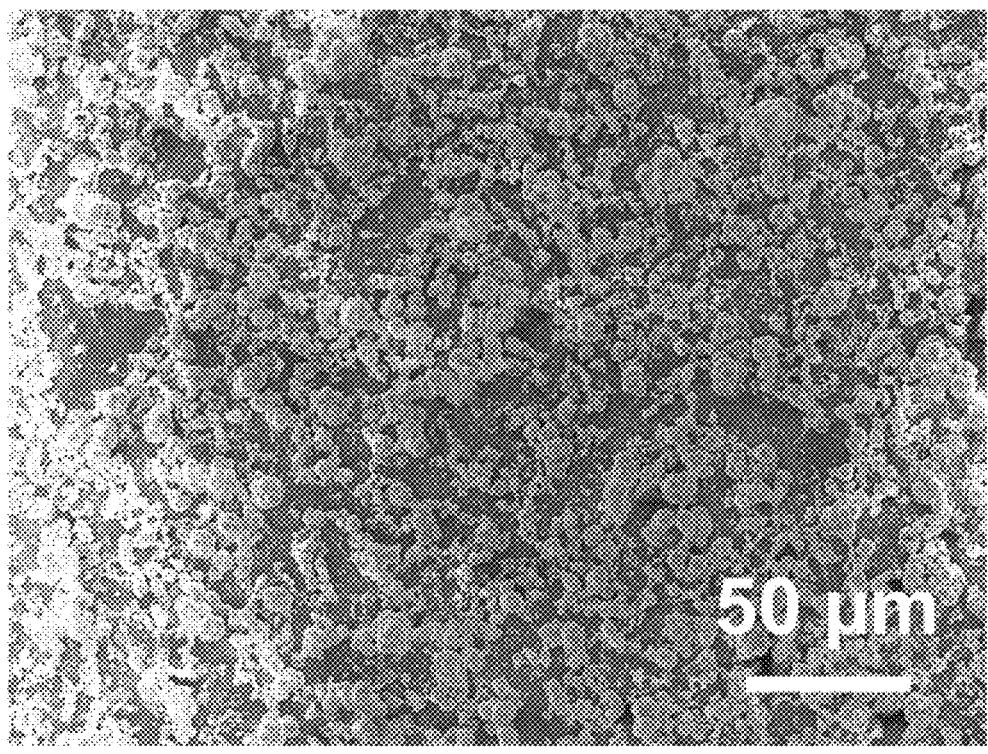
FIG. 4 is an image of a film scanned by a scanning electron microscope, wherein the film is formed by using a method for forming film of the present invention.
Figure 5:
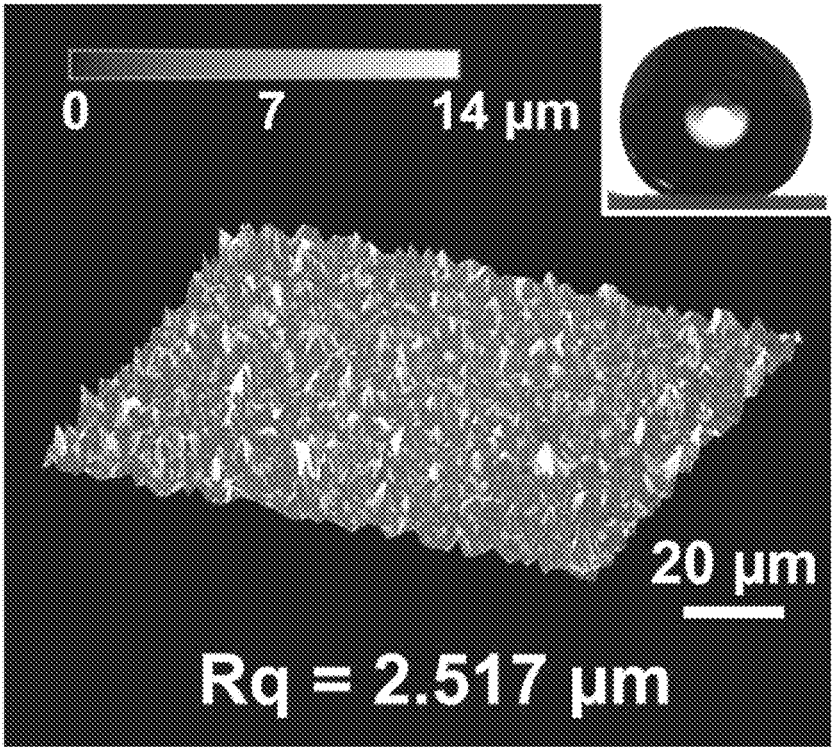
FIG. 5 shows a profile roughness distribution of a film scanned by a 3D surface profile laser microscope and an image of water droplets on the film formed by using a method for forming film of the present invention.
Figure 6:
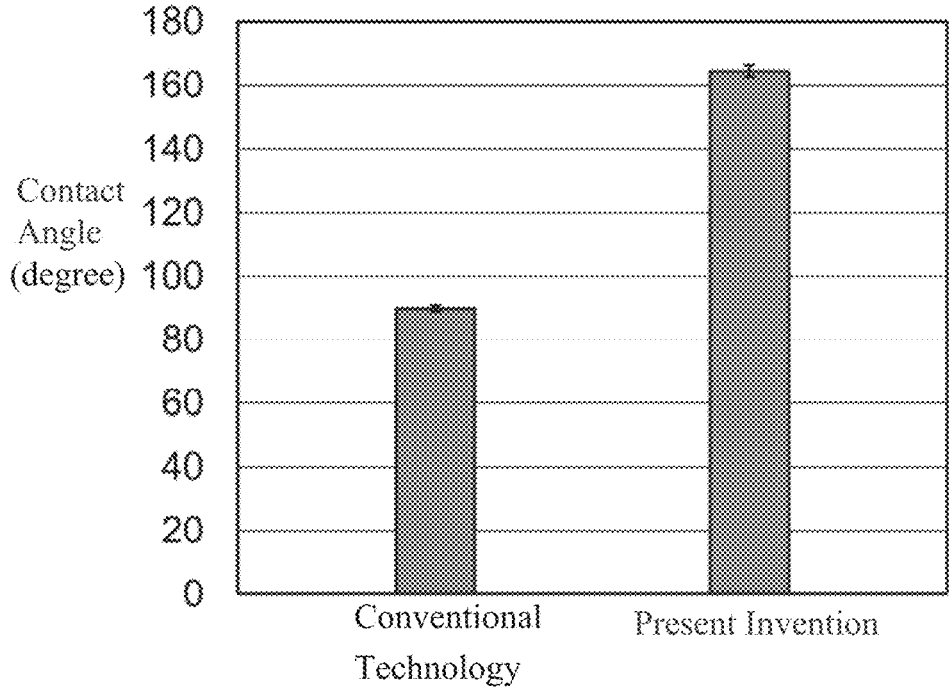
FIG. 6 is a comparison result of a contact angle of water droplets on a film formed by using a method for forming film of conventional technology and a contact angle of water droplets on a film formed by using a method for forming film of the present invention.

Please refer to FIG. 3, which shows a microscopic image of a solid state sacrificial material layer (ice) formed by a gaseous state sacrificial material (water vapor) desublimating into solid state on a surface of a workpiece using a desublimation process of a method for forming film of the present invention. In the Step A (performing a desublimation process), the solid state sacrificial material layer 5 formed on the surface 40 of the workpiece 4 includes many solid state ice crystals that have desublimated into solid state. Therefore, an outer surface of the solid state sacrificial material layer 5 formed on the surface 40 of the workpiece 4 is not smooth or flat, but is uneven (as shown in FIG. 3). Please also refer to FIG. 4, which shows an image of a film (the polymer layer 50 composed of poly(para-xylylene)) scanned by a scanning electron microscope (SEM), wherein the film is formed by using a method for forming film of the present invention. In the Step C (performing a sublimation and deposition process), wherein (1) the solid state sacrificial material layer 5 gradually sublimates into gaseous state and (2) the plurality of reactive polymer monomers starts being deposited on the solid state sacrificial material layer 5 (solid state ice crystals) on the surface 40 of the workpiece 4 through the adsorption process and the polymerization reaction of the plurality of reactive polymer monomers is initiated, the above (1) and (2) both occur simultaneously in the sublimation and deposition chamber 30. The plurality of reactive polymer monomers starts adsorbing and being deposited on the uneven outer surface of the solid state sacrificial material layer 5 (solid state ice crystals), and then gradually initiate the polymerization reaction of the plurality of reactive polymer monomers. Hence, in the Step C, an outer surface of the polymer layer 50 (composed of poly (para-xylylene)) deposited on the surface 40 of the workpiece 4 is not smooth, but uneven (as shown in FIG. 4). Please also refer to FIG. 5, which shows a profile roughness distribution of a film (the polymer layer 50 composed of poly(para-xylylene)) scanned by a 3D surface profile laser microscope and an image of water droplets on the film (the polymer layer 50 composed of poly(para-xylylene)) formed by using a method for forming film of the present invention. As shown in FIG. 5, the film (the polymer layer 50 composed of poly(para-xylylene)) scanned by the 3D surface profile laser microscope has a root mean square roughness (Rq)=2.517 μm which is much larger than a root mean square roughness (Rq=0.067 μm) of the film (the polymer layer 98 composed of poly(para-xylylene)) formed by the method for forming film of conventional technology. Please refer to the image of water droplets on the film (the polymer layer 50 composed of poly(para-xylylene)) in the upper right corner of FIG. 5, and please also refer to FIG. 6, which shows a comparison result of a contact angle of water droplets on a film formed by using a method for forming film of conventional technology and a contact angle of water droplets on a film formed by using a method for forming film of the present invention. The bar graph of the left side of FIG. 6 shows that a contact angle of water droplets on the film (the polymer layer 98 composed of poly(para-xylylene)) formed by using the method for forming film of conventional technology is approximately 90°; while the bar graph of the right side of FIG. 6 shows that a contact angle of water droplets on the film (the polymer layer 50 composed of poly(para-xylylene)) formed by using the method for forming film of the present invention is approximately 164° (much larger than the 90° of conventional technology).

Therefore, the roughness of the film formed by the method for forming film of the present invention can indeed be increased; in addition, when the film formed by the method for forming film of the present invention is used as an exposed surface, a contact angle between liquid and the film (the exposed surface) formed by the method for forming film of the present invention can indeed be increased. Therefore, the film formed by the method for forming film of the present invention can be applied to the applications of the outer surfaces of medical equipment, self-cleaning surfaces or anti-pollution surfaces, or waterproof, water-repellent etc. to greatly reduce the adhesion of liquid to the surfaces of medical equipment, self-cleaning surfaces or anti-pollution surfaces.

In some embodiments, the pressure relief valve 23 can be replaced by a vacuum pump to control the pressure in the desublimation chamber 20.

Figure 7A:
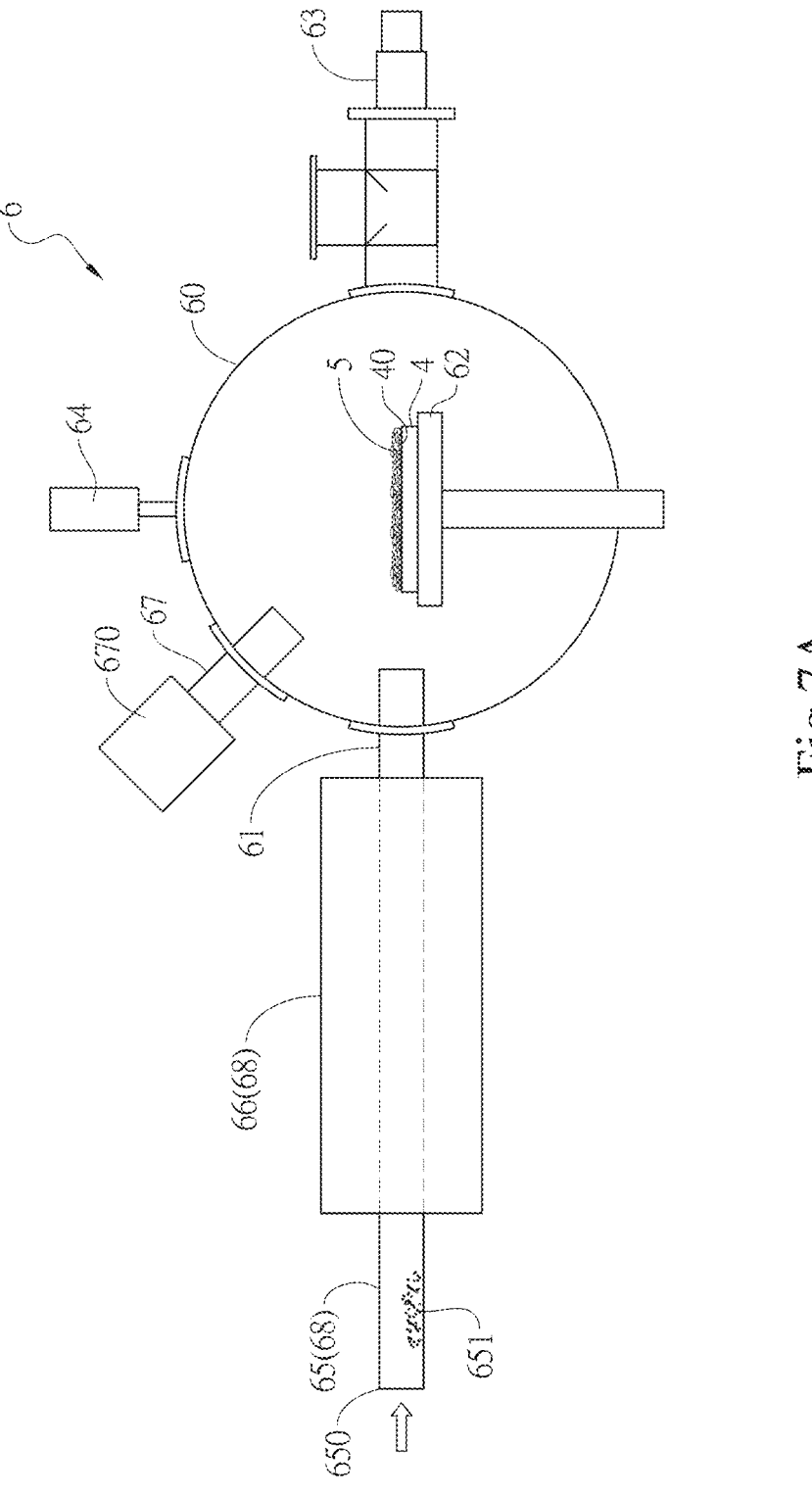
FIGS. 7A and 7B are cross-sectional schematic views of an embodiment of a second film forming system of the present invention used for performing a desublimation process and a sublimation and deposition process of a method for forming film of the present invention.
Figure 7B:
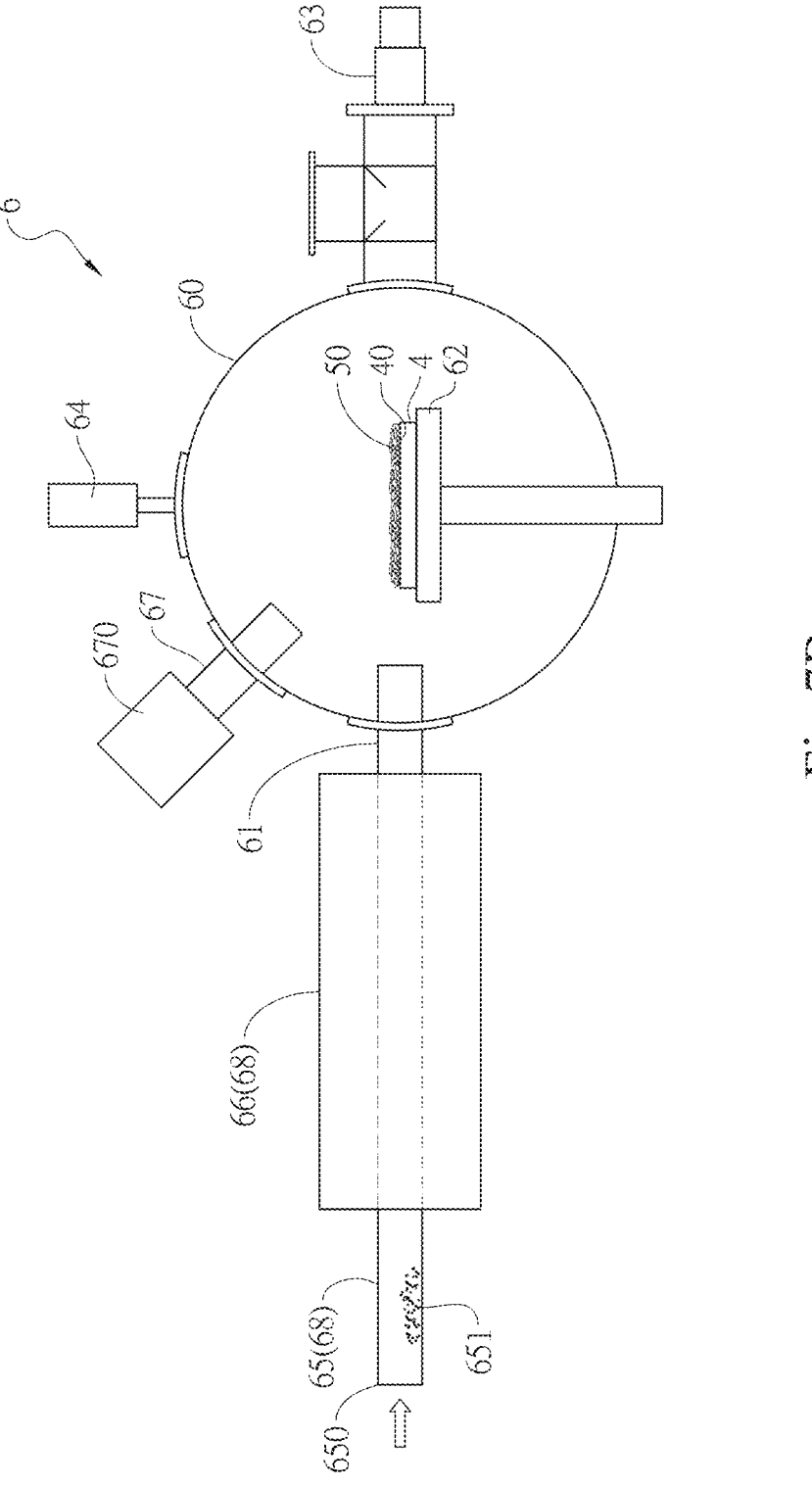
Figure 8:
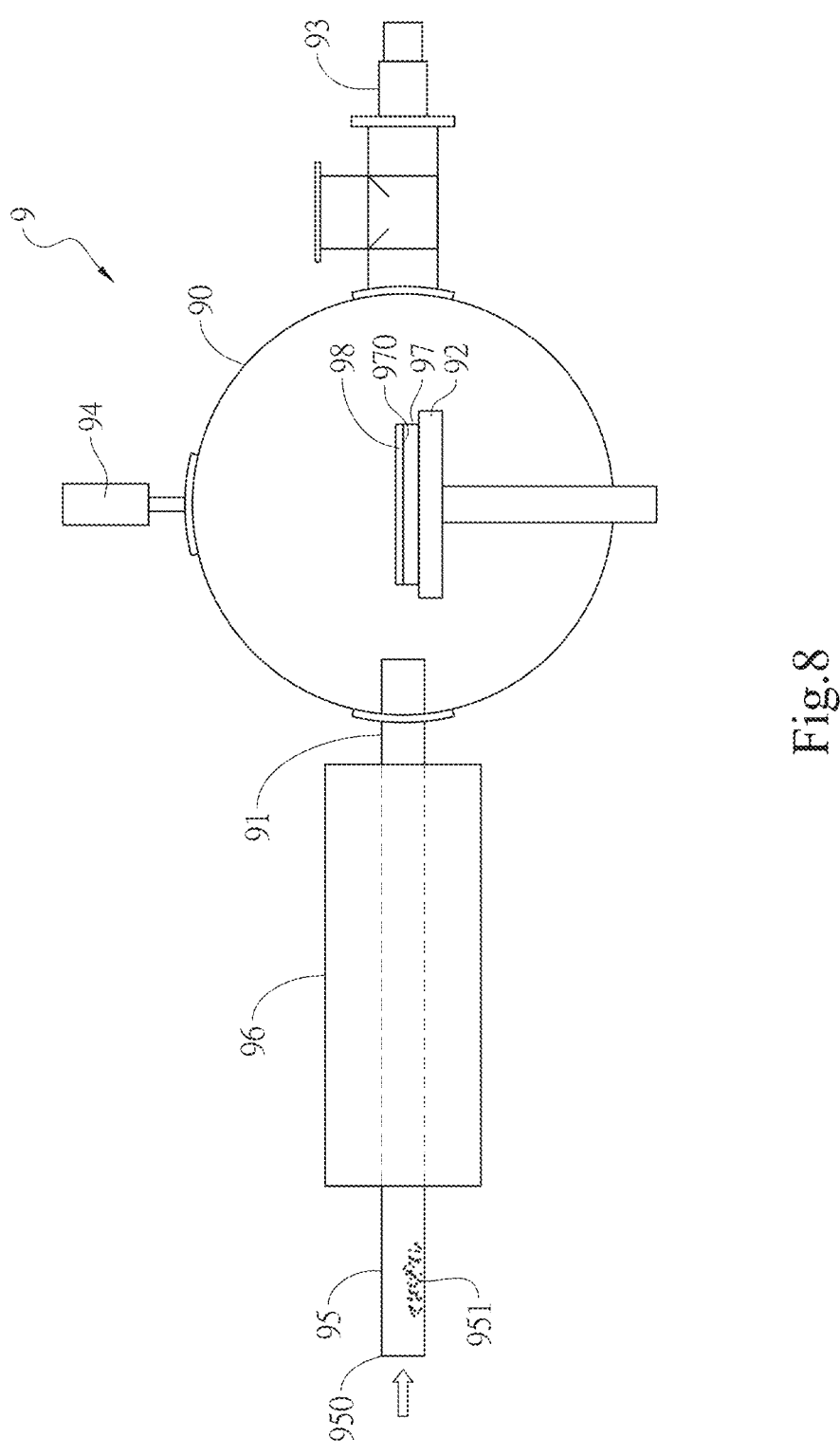
FIG. 8 is a cross-sectional schematic view of an embodiment of a film forming system of convention technology.
Figure 9:
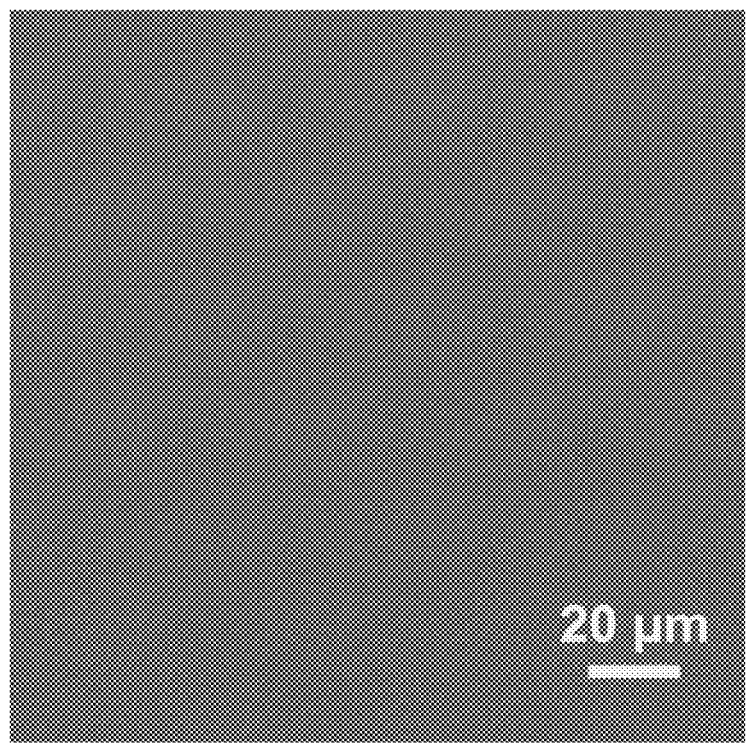
FIG. 9 is an image of a film scanned by a scanning electron microscope, wherein the film is formed by using a method for forming film of conventional technology.
Figure 10:
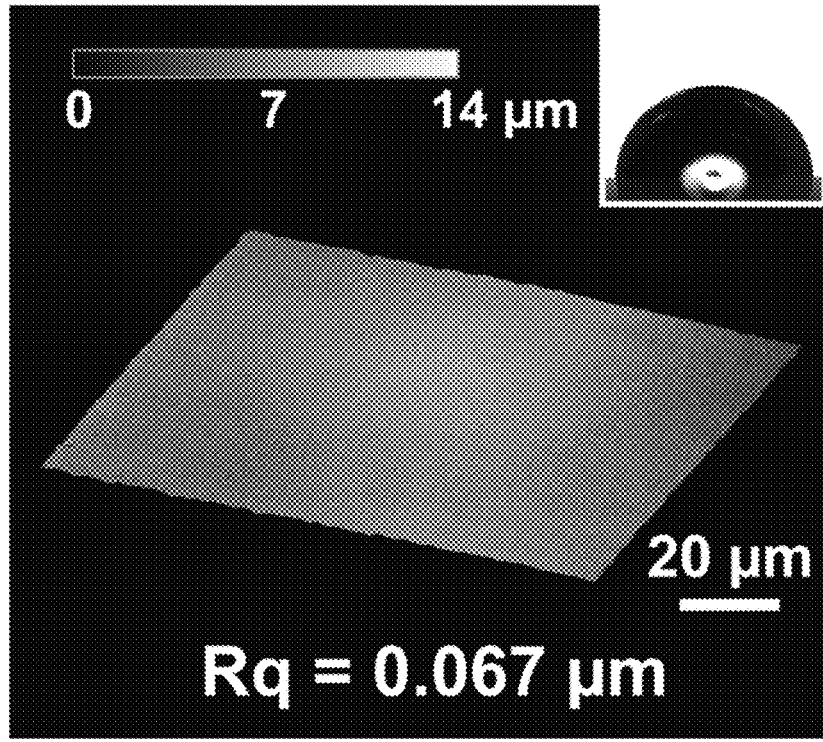
FIG. 10 shows a profile roughness distribution of a film scanned by a 3D surface profile laser microscope and an image of water droplets on the film is formed by using a method for forming film of conventional technology.

Please refer to FIGS. 7A and 7B, which show cross-sectional schematic views of an embodiment of a second film forming system of the present invention used for performing a desublimation process and a sublimation and deposition process of a method for forming film of the present invention. In the embodiment of FIGS. 7A and 7B, a second film forming system 6 of the present invention comprises: a chamber device 60, a reactive polymer monomers input terminal 61, a temperature control carrier 62, a vacuum pump 63, a pressure gauge 64, a precursor sublimation zone 65, a pyrolysis zone 66, a sacrificial material input valve 67 and a sacrificial material supply source 670. The vacuum pump 63 and the pressure gauge 64 are in communication with the chamber device 60. The pressure gauge 64 is used for monitoring a pressure in the chamber device 60. The vacuum pump 63 is used for controlling the pressure in the chamber device 60. One end of the temperature control carrier 62 disposed in the chamber device 60 is used for carrying a workpiece 4, and the temperature control carrier 62 can also control the temperature of the workpiece 4. The precursor sublimation zone 65 is in communication with the pyrolysis zone 66. The pyrolysis zone 66 is in communication with the chamber device 60 through the reactive polymer monomers input terminal 61. The sacrificial material input valve 67 is in communication with the sacrificial material supply source 670 and the chamber device 60 respectively. The sacrificial material supply source 670 inputs a gaseous state sacrificial material into the chamber device 60 through the sacrificial material input valve 67. The sacrificial material input valve 67 can control an amount and a flow rate of the gaseous state sacrificial material input into the chamber device 60. The precursor sublimation zone 65 and the pyrolysis zone 66 can be considered as a reactive polymer monomers supply source 68.

A method for forming film of the present invention comprises following steps of: Step D: closing a reactive polymer monomers input terminal 61; Step E: performing a desublimation process; Step F: removing a gaseous state sacrificial material from a chamber device 60 and then opening the reactive polymer monomers input terminal 61; and Step G: performing a sublimation and deposition process. In the Step D, firstly the reactive polymer monomers input terminal 61 has to be closed. The Step E (performing a desublimation process) comprises following steps of: providing a workpiece 4 to a temperature control carrier 62 in the chamber device 60; providing the gaseous state sacrificial material into the chamber device 60 by a sacrificial material supply source 670 through a sacrificial material input valve 67; and controlling a temperature of the workpiece 4 within a desublimation temperature range by the temperature control carrier 62, so that the gaseous state sacrificial material desublimates into solid state on a surface 40 of the workpiece 4 to form a solid state sacrificial material layer 5 on the surface 40 of the workpiece 4 (as shown in FIG. 7A). The surface 40 of the workpiece 4 of the present invention is an exposed surface; hence, the gaseous state sacrificial material can desublimate into solid state on the surface 40 of the workpiece 4 to form the solid state sacrificial material layer 5 on the surface 40 of the workpiece 4. In current embodiment, the gaseous state sacrificial material is gaseous water (i.e., water vapor); a pressure in the chamber device 60 is greater than or equal to 1 atm (or standard pressure); the desublimation temperature range is smaller than or equal to $-100°$ C. When the sacrificial material supply source 670 starts providing the gaseous water into the chamber device 60 through the sacrificial material input valve 67, such that a relative vapor concentration (i.e., a relative humidity) of the gaseous water in the desublimation chamber 20 is gradually increased, and the gaseous water in the desublimation chamber 20 starts gradually desublimating into solid state (i.e., ice) on the surface 40 of the workpiece 4. A rate that the gaseous water desublimating into solid state ice in the chamber device 60 is related to the relative vapor concentration (the relative humidity) of the gaseous water in the chamber device 60. The rate that the gaseous water desublimating into solid state ice in the chamber device 60 can be controlled by controlling the relative vapor concentration (the relative humidity) of the gaseous water in the chamber device 60. In current embodiment, the relative vapor concentration (the relative humidity) of the gaseous water in the chamber device 60 is controlled to be greater than or equal to 50%. As time goes by, the gaseous water in the chamber device 60 gradually desublimates into solid state ice on the surface 40 of the workpiece 4 and gradually forms a solid state sacrificial material layer 5 (i.e., a solid state ice layer; as shown in FIG. 7A) on the surface 40 of the workpiece 4. In the Step F: removing the gaseous state sacrificial material from the chamber device 60, for example, removing by purging; and then opening the reactive polymer monomers input terminal 61. The Step G (performing a sublimation and deposition process) comprises following steps of: controlling a pressure of the chamber device 60 within a sublimation deposition pressure range by a vacuum pump 63 (with a pressure gauge 64 monitoring the pressure), and controlling a temperature of the workpiece 4 on the temperature control carrier 62 in the chamber device 60 within a sublimation deposition temperature range by the temperature control carrier 62, such that the solid state sacrificial material layer 5 on the surface 40 of the workpiece 4 starts gradually sublimating into gaseous state; and providing a plurality of reactive polymer monomers into the chamber device 60 through the reactive polymer monomers input terminal 61, such that the plurality of reactive polymer monomers starts being deposited on the solid state sacrificial material layer 5 on the surface 40 of the workpiece 4 through an adsorption process, and a polymerization reaction of the plurality of reactive polymer monomers is initiated, at the same time, the solid state sacrificial material layer 5 continues gradually subli-mating into gaseous state; (as shown in FIG. 7B) until the solid state sacrificial material layer 5 completely sublimates into gaseous state, and the plurality of reactive polymer monomers forms a polymer layer 50 deposited on the surface 40 of the workpiece 4 after the polymerization reaction (the solid state sacrificial material layer 5 on the surface 40 of the workpiece 4 has completely sublimated into gaseous state). In current embodiment, a temperature in a precursor sublimation zone 65 is controlled to be greater than or equal to 0° C. and smaller than or equal to 270° C.; a pressure in the precursor sublimation zone 65 is controlled to be smaller than or equal to 0.5 Torr; a temperature in a pyrolysis zone 66 is controlled to be greater than or equal to 400° C.; a pressure in the pyrolysis zone 66 is controlled to be smaller than or equal to 0.5 Torr; wherein the sublimation deposition temperature range is greater than or equal to –20° C. and smaller than or equal to –4° C.; the sublimation deposition pressure range is smaller than or equal to 0.5 Torr; wherein a powdered precursor 651 (paracyclophane) is disposed in the precursor sublimation zone 65, and an argon (Ar) gas is input into the precursor sublimation zone 65 from an input terminal 650 of the precursor sublimation zone 65, such that the powdered precursor 651 (paracyclophane) is sublimated into a gaseous state paracyclophane in the precursor sublimation zone 65. The gaseous state paracyclophane flows into the pyrolysis zone 66 with the argon gas, such that the gaseous state paracyclophane is pyrolyzed into a plurality of reactive polymer monomers (para-xylylene). And then the plurality of reactive polymer monomers (para-xylylene) flows into the chamber device 60 through the reactive polymer monomers input terminal 61 with the argon gas. After the polymerization reaction, the plurality of reactive polymer monomers (para-xylylene) forms a polymer layer 50 deposited on the surface 40 of the workpiece 4 (as shown in FIG. 7B), wherein the polymer layer 50 is composed of poly(para-xylylene).

The embodiment of FIGS. 1 and 2 and the embodiment of FIGS. 7A and 7B all use water as the sacrificial material. The main difference between the embodiment of FIGS. 1 and 2 and the embodiment of FIGS. 7A and 7B is: the embodiment of FIGS. 1 and 2 respectively uses two independent equipment (the first film forming system 1 comprises the desublimation process equipment 2 and the sublimation and deposition process equipment 3) to perform the desublimation process and the sublimation and deposition process of the method for forming film of the present invention respectively; while the embodiment of FIGS. 7A and 7B uses an integrated equipment (the second film forming system 6), and uses the integrated second film forming system 6 to perform the desublimation process and the sublimation and deposition process of the method for forming film of the present invention respectively. When the embodiment of FIGS. 7A and 7B uses the same conditions (for example, the same sacrificial material (such as water), the same relative vapor concentration (the relative humidity) of the gaseous water in the desublimation chamber 20/chamber device 60, the same pressure in the desublimation chamber 20/chamber device 60, the same temperature of the workpiece 4 during the desublimation process, the same pressure in the sublimation and deposition chamber 30/chamber device 60, the same temperature of the workpiece 4 during the sublimation and deposition process, the same reactive polymer monomers, etc.) as the embodiment of FIGS. 1 and 2 for forming the film, the film (the polymer layer 50 composed of poly(para-xylylene) as shown in FIG. 7B) formed in the embodiment of FIGS. 7A and 7B is the same as the film (the polymer layer 50 composed of poly(para-xylylene) as shown in FIG. 2) formed in the embodiment of FIGS. 1 and 2. The polymer layer 50 composed of poly(para-xylylene) in FIG. 7B and the polymer layer 50 composed of poly(para-xylylene) as shown in FIG. 2, both have the high roughness surfaces as shown in FIGS. 4 and 5, and both have the characteristics of a contact angle of approximately 164° as shown in FIGS. 5 and 6. In addition, in the desublimation process, the solid state sacrificial material layer 5 (solid state ice crystals) as shown in FIG. 3 can also be formed. Therefore, the roughness of the film formed by the method for forming film of the present invention can indeed be increased; in addition, when the film formed by the method for forming film of the present invention is used as an exposed surface, a contact angle between liquid and the film (the exposed surface) formed by the method for forming film of the present invention can indeed be increased.

In some embodiments, the material of the polymer layer 50 is at least one selected from the group consisting of poly(p-xylylene), functionalized poly(p-xylylene), poly(tetrafluoroethylene), poly(alkyl acrylates), poly(3, 4-ethylenedioxythiophene), poly(4-vinylpyridine), poly(2-hydroxyethyl methacrylate), poly(1H, 1H, 2H, 2H-perfluorodecyl acrylate), poly(glycidyl methacrylate), poly(p-phenylenevinylene), poly(methyl methacrylate), poly(N-vinylcaprolactam), poly(N-isopropylacrylamide) and poly(dimethylsiloxane).

In some embodiments, when water is used as the sacrificial material, the relative vapor concentration of the gaseous water in the desublimation chamber 20 of the chamber device 10 can be controlled to be (a) greater than or equal to 30%, (b) greater than or equal to 35%, (c) greater than or equal to 40%, (d) greater than or equal to 45%, (e) greater than or equal to 55%, or (f) greater than or equal to 60%.

In some embodiments, when water is used as the sacrificial material, during the desublimation process, the pressure in the desublimation chamber 20 of the chamber device 10 of the desublimation process equipment 2 of the first film forming system 1 or the pressure in the chamber device 60 of the second film forming system 6 is greater than or equal to 1 atm and the desublimation temperature range is (a) smaller than or equal to 0° C., (b) smaller than or equal to –10° C., (c) smaller than or equal to –20° C., (d) smaller than or equal to –30° C., (e) smaller than or equal to –50° C., (f) smaller than or equal to –70° C., (g) smaller than or equal to –80° C., (h) smaller than or equal to –90° C., (i) smaller than or equal to –110° C., (j) smaller than or equal to –130° C., (k) smaller than or equal to –150° C., (l) smaller than or equal to –170° C., or (m) smaller than or equal to –200° C.

In some embodiments, the first film forming system 1 (including the desublimation process equipment 2 and the sublimation and deposition process equipment 3) of the embodiment of FIGS. 1 and 2 or the second film forming system 6 of the embodiment of FIGS. 7A and 7B can be used to form the film, and the sacrificial material can be carbon dioxide (CO2). During the desublimation process, the pressure in the desublimation chamber 20 of the chamber device 10 of the desublimation process equipment 2 of the first film forming system 1 or the pressure in the chamber device 60 of the second film forming system 6 can be (1) greater than or equal to 1 atm and smaller than or equal to 5 atm, (2) greater than or equal to 1.5 atm and smaller than or equal to 5 atm, (3) greater than or equal to 2 atm and smaller than or equal to 5 atm, (4) greater than or equal to 2.5 atm and smaller than or equal to 5 atm, (5) greater than or equal to 3 atm and smaller than or equal to 5 atm, (6) greater than or equal to 3.5 atm and smaller than or equal to 5 atm, (7) greater than or equal to 4 atm and smaller than or equal to 5 atm, or (8) greater than or equal to 4.5 atm and smaller than or equal to 5 atm; and the desublimation temperature range can be (a) smaller than or equal to –80° C., (b) smaller than or equal to –90° C., (c) smaller than or equal to –100° C., (d) smaller than or equal to –120° C., (e) smaller than or equal to –140° C., (f) smaller than or equal to –160° C., (g)

smaller than or equal to $-180°$ C., (h) smaller than or equal to $-200°$ C., (i) smaller than or equal to $-220°$ C., or (j) smaller than or equal to $-240°$ C.; and a relative vapor concentration of the gaseous carbon dioxide (the gaseous state sacrificial material) in the desublimation chamber 20 of the chamber device 10 of the desublimation process equipment 2 of the first film forming system 1 or in the chamber device 60 of the second film forming system 6 can be controlled to be (a) greater than or equal to 30%, (b) greater than or equal to 35%, (c) greater than or equal to 40%, (d) greater than or equal to 45%, (e) greater than or equal to 55%, or (f) greater than or equal to 60%.

In some embodiments, the first film forming system 1 (including the desublimation process equipment 2 and the sublimation and deposition process equipment 3) of the embodiment of FIGS. 1 and 2 or the second film forming system 6 of the embodiment of FIGS. 7A and 7B can be used to form the film, and the sacrificial material can be iodine. During the desublimation process, the pressure in the desublimation chamber 20 of the chamber device 10 of the desublimation process equipment 2 of the first film forming system 1 or the pressure in the chamber device 60 of the second film forming system 6 can be greater than or equal to 1 atm; and the desublimation temperature range can be (a) smaller than or equal to 10° C., (b) smaller than or equal to 20° C., (c) smaller than or equal to 30° C., (d) smaller than or equal to 40° C., (e) smaller than or equal to 50° C., (f) smaller than or equal to 60° C., (g) smaller than or equal to 70° C., (h) smaller than or equal to 80° C., (i) smaller than or equal to 90° C., (j) smaller than or equal to 100° C., or (k) smaller than or equal to 110° C.; and a relative vapor concentration of the gaseous iodine (the gaseous state sacrificial material) in the desublimation chamber 20 of the chamber device 10 of the desublimation process equipment 2 of the first film forming system 1 or in the chamber device 60 of the second film forming system 6 can be controlled to be (a) greater than or equal to 30%, (b) greater than or equal to 35%, (c) greater than or equal to 40%, (d) greater than or equal to 45%, (e) greater than or equal to 55%, or (f) greater than or equal to 60%.

In some embodiments, the material of the workpiece 4 is at least one selected from the group consisting of metal, ceramic, polymer materials, semiconductor, oxide, nitride and sulfide.

In the present invention, the surface 40 of the workpiece 4 is an exposed surface. In some embodiments, the surface 40 of the workpiece 4 may be an outer surface. In some other embodiments, the surface 40 of the workpiece 4 may be an inner surface having at least one opening. In some other embodiments, the surface 40 of the workpiece 4 may be an outer surface, an inner surface having at least one opening, or any combination thereof.

In some embodiments, the surface 40 of the workpiece 4 may be a flat surface. In some other embodiments, the surface 40 of the workpiece 4 may be a curved surface. In some other embodiments, the surface 40 of the workpiece 4 may be an irregular surface. In some other embodiments, the surface 40 of the workpiece 4 may be an irregular surface, a flat surface, a curved surface, or any combination thereof.

In some embodiments, the gas input into the precursor sublimation zone 35 from the input terminal 350 of the precursor sublimation zone 35 or input into the precursor sublimation zone 65 from the input terminal 650 of the precursor sublimation zone 65 may be helium (He) gas, neon (Ne) gas, argon (Ar) gas, krypton (Kr) gas, xenon (Xe) gas, or any combination thereof.

As disclosed in the above description and attached drawings, the present invention can provide a method for forming film. It is new and can be put into industrial use.

Although the embodiments of the present invention have been described in detail, many modifications and variations may be made by those skilled in the art from the teachings disclosed hereinabove. Therefore, it should be understood that any modification and variation equivalent to the spirit of the present invention be regarded to fall into the scope defined by the appended claims.

What is claimed is:

1. A method for forming film comprising following steps of:

performing a desublimation process, the desublimation process includes following steps of:

providing a workpiece into a chamber device;

providing a gaseous state sacrificial material into the chamber device, wherein the gaseous state sacrificial material is composed of iodine; and controlling a temperature of the workpiece within a desublimation temperature range, so that the gaseous state sacrificial material desublimates into solid state on a surface of the workpiece to form a solid state sacrificial material layer on the surface of the workpiece, wherein during the desublimation process, the desublimation temperature range is smaller than or equal to 110° C., and a pressure in the chamber device is greater than or equal to 1 atm; and performing a sublimation and deposition process, the sublimation and deposition process includes following steps of:

controlling the pressure in the chamber device within a sublimation deposition pressure range, and controlling the temperature of the workpiece in the chamber device within a sublimation deposition temperature range, so that the solid state sacrificial material layer on the surface of the workpiece starts gradually sublimating into gaseous state; and providing a plurality of reactive polymer monomers into the chamber device, so that the plurality of reactive polymer monomers starts being deposited on the solid state sacrificial material layer on the surface of the workpiece through an adsorption process, and a polymerization reaction of the plurality of reactive polymer monomers is initiated, at the same time, the solid state sacrificial material layer continues gradually sublimating into gaseous state; until the solid state sacrificial material layer completely sublimates into gaseous state, and the plurality of reactive polymer monomers forms a polymer layer deposited on the surface of the workpiece after the polymerization reaction.

2. The method for forming film according to claim 1, wherein after performing the desublimation process and before performing the sublimation and deposition process, the method further comprises a following step of: removing the gaseous state sacrificial material from the chamber device.

3. The method for forming film according to claim 1, wherein the chamber device includes a desublimation chamber and a sublimation and deposition chamber, wherein the desublimation process is performed in the desublimation chamber of the chamber device, wherein after performing the desublimation process and before performing the sublimation and deposition process, the method further comprises a following step of: moving the workpiece from the desublimation chamber of the chamber device to the sublimation and deposition chamber of the chamber device, such that the sublimation and deposition process is performed in the sublimation and deposition chamber of the chamber device.

4. The method for forming film according to claim 1, wherein the material of the polymer layer is at least one selected from the group consisting of poly(p-xylylene), functionalized poly(p-xylylene), poly(tetrafluoroethylene), poly(alkyl acrylates), poly(3, 4-ethylenedioxythiophene), poly(4-vinylpyridine), poly(2-hydroxyethyl methacrylate), poly(1H, 1H, 2H, 2H-perfluorodecyl acrylate), poly(glycidyl methacrylate), poly(p-phenylenevinylene), poly (methyl methacrylate), poly(N-vinylcaprolactam), poly(N-isopropylacrylamide) and poly(dimethylsiloxane).

5. The method for forming film according to claim 1, wherein during the desublimation process, a relative vapor concentration of the gaseous state sacrificial material in the chamber device is greater than or equal to 30%.

6. The method for forming film according to claim 1, wherein the surface of the workpiece is an irregular surface, a flat surface, a curved surface, or any combination thereof.

7. The method for forming film according to claim 1, wherein the surface of the workpiece is an outer surface, an inner surface having at least one opening, or any combination thereof.

8. The method for forming film according to claim 1, wherein the material of the workpiece is at least one selected from the group consisting of metal, ceramic, polymer materials, semiconductor, oxide, nitride and sulfide.

\* \* \* \* \*